United States Patent
Ip et al.

(10) Patent No.: US 7,418,678 B1
(45) Date of Patent: Aug. 26, 2008

(54) MANAGING FORMAL VERIFICATION COMPLEXITY OF DESIGNS WITH COUNTERS

(75) Inventors: Chung-Wah N Ip, Fremont, CA (US); Lawrence Loh, Milpitas, CA (US); Vigyan Singhal, Fremont, CA (US); Howard Wong-Toi, Albany, CA (US)

(73) Assignee: Jasper Design Automation, Inc., Mountain View, CA (US)

(*) Notice: Subject to any disclaimer, the term of this patent is extended or adjusted under 35 U.S.C. 154(b) by 335 days.

(21) Appl. No.: 10/909,099

(22) Filed: Jul. 29, 2004

Related U.S. Application Data

(63) Continuation of application No. 10/736,826, filed on Dec. 15, 2003, now abandoned.

(60) Provisional application No. 60/526,156, filed on Dec. 1, 2003.

(51) Int. Cl.
*G06F 17/50* (2006.01)
*G06F 9/45* (2006.01)

(52) U.S. Cl. .............................. 716/5; 715/4

(58) Field of Classification Search .................. 716/4–6
See application file for complete search history.

(56) References Cited

U.S. PATENT DOCUMENTS

| | | | |
|---|---|---|---|
| 2002/0095645 A1* | 7/2002 | Rodeh | 716/4 |
| 2003/0200515 A1* | 10/2003 | Ly et al. | 716/5 |
| 2004/0123254 A1* | 6/2004 | Geist et al. | 716/4 |
| 2004/0153308 A1* | 8/2004 | McMillan et al. | 704/5 |
| 2004/0168137 A1* | 8/2004 | Baumgartner et al. | 716/5 |

* cited by examiner

*Primary Examiner*—Jack Chiang
*Assistant Examiner*—Suresh Memula
(74) *Attorney, Agent, or Firm*—Fenwick & West LLP

(57) ABSTRACT

A counter abstraction tool generates an abstraction model for one or more counters in a circuit design for use with a formal verification system. The tool detects the presence of a counter in a circuit design, identifies one or more special values for the counter, and creates an abstraction for the counter. The tool can automatically perform the abstraction, guide a user in configuring the appropriate abstraction for the counter, or perform a combination of automatic and manual abstraction. The tool may further accommodate related counters.

29 Claims, 7 Drawing Sheets

Property: p = $\overline{\text{timeout}}$ || (data != mem[0])

Table A: Non-Abstracted Counter

| v | 0 | 1 | 2 | 3 | 4 | 5 | 6 | 7 | 8 | 9 |
|---|---|---|---|---|---|---|---|---|---|---|
| timeout | 0 | 0 | 0 | 0 | 0 | 0 | 0 | 0 | 0 | 1 |
| data | 1 | 1 | 1 | 1 | 1 | 1 | 1 | 1 | 1 | 1 |
| mem[0] | 1 | 1 | 1 | 1 | 1 | 1 | 1 | 1 | 1 | 1 |
| p | 1 | 1 | 1 | 1 | 1 | 1 | 1 | 1 | 1 | 0 |

Bug

Table B: Abstracted Counter

| v | 0 | 0 < v < 8 | 0 < v < 8  or  v == 8 | 0 < v < 9  or  8 < v < MAX |
|---|---|---|---|---|
| timeout | 0 | 0 | 0 | 0 | 0 | 1 |
| data | 1 | 1 | 1 | 1 | 1 | 1 |
| mem[0] | 1 | 1 | 1 | 1 | 1 | 1 |
| p | 1 | 1 | 1 | 1 | 1 | 0 |

Bug

Which of the following values for counter 'CNTR_1' do you think are important to the validity of property 'P_12'?
(Check all that apply.)

☐ 0            ☐ 17

☐ 8            ☐ 156

( Use selected values )    ( I don't know )

Fig. 9

MANAGING FORMAL VERIFICATION COMPLEXITY OF DESIGNS WITH COUNTERS

CROSS REFERENCE TO RELATED APPLICATIONS

This application is a continuation of U.S. application Ser. No. 10/736,826, filed Dec. 15, 2003 now abandoned, which is incorporated in its entirety by reference. This application also claims the benefit of U.S. Provisional Application No. 60/526,156, filed Dec. 1, 2003, which is incorporated in its entirety by reference.

BACKGROUND

1. Field of the Invention

This invention relates generally to the field of functional verification of digital designs with respect to a set of requirements, and specifically to the formal verification of designs that have counters.

2. Background of the Invention

Over the last 30 years, the complexity of integrated circuits has increased greatly. This increase in complexity has exacerbated the difficulty of verifying circuit designs. In a typical integrated circuit design process, which includes many steps, the verification step consumes approximately 70-80% of the total time and resources. Aspects of the circuit design such as time-to-market and profit margin greatly depend on the verification step. As a result, flaws in the design that are not found during the verification step can have significant economic impact by increasing time-to-market and reducing profit margins. To maximize profit, therefore, the techniques used for verification should be as efficient as possible.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL describes the registers of a computer or digital electronic system and the way in which data are transferred among them.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical design tools to create a HDL-based design.

In the design flow, creation of the RTL source code is followed by verification of the design to check if the RTL source code meets various design specifications. This verification is performed by simulation of the RTL code using a "test bench," which includes stimulus generators and requirement monitors. The verification method involving the use of RTL source code and test bench is referred to as the simulation process. For a circuit having n inputs, there would be $2^n$ possible combinations of inputs at any given time. Where n is large, such as for a complex design, the number of possible input sequences becomes prohibitively large for verification. To simplify the verification process, therefore, only a subset of all possible inputs is described in a particular test bench.

The increasing complexity of circuit designs has lead to several drawbacks associated with simulation-based techniques. Reasons for these drawbacks include the requirement of a large amount of time to verify circuit designs, the use of a large amount of resources and thus large costs, and the inability to verify large designs completely and quickly. For large and complex designs in which many combinations of inputs are possible, therefore, the simulation process is not reliable. This is because the simulation process verifies the circuit only for a subset of inputs described in the test bench; thus, circuit behavior for all possible combinations of inputs is not checked.

An increasingly popular alternative is to use formal methods to verify the properties of a design completely. Formal methods use mathematical techniques to prove that a design property is either always true or to provide an example condition (called a counterexample) that demonstrates the property is false. Tools that use formal methods to verify RTL source code and design properties are known as "model checkers." Design properties to be verified include specifications and/or requirements that must be satisfied by the circuit design. Since mathematical properties define the design requirements in pure mathematical terms, this enables analysis of all possible valid inputs for a given circuit and is akin to an exhaustive simulation. Formal verification methods are therefore more exhaustive when compared to simulation methods. Moreover, formal verification methods provide many advantages over the simulation methods, such as reduced validation time, quicker time-to-market, reduced costs, and high reliability.

Performance limits and resource availability inhibit the widespread use of model checking. The resources required to perform verification are typically exponentially related to the number of registers in the circuit model, as well as other characteristics. This is referred to as the "state space explosion" problem. Many conventional model checkers analyze the entire design before proving a particular property, verifying the behavior of the design with all possible inputs at all times. These model checking techniques thus rely on an underlying reachability analysis and must iterate through time to collect all possible states into a data structure. But the complexity and size of modern integrated circuits, combined with the state space explosion problem, make it impossible to use conventional model checkers on complex designs.

These problems are exacerbated for circuit designs that have counters. Where a design includes one or more counters, the number of iterations in the reachability analysis is typically proportional to the number of possible counts in the counters. As a result, formal verification of designs with counters typically requires many iterations; hence, formal verification tools require a long time to finish their analysis. Moreover, the scenarios or counterexamples generated by the formal verification tool tend to be long, tedious to read, or difficult to understand.

One way to deal with counters in the verification process is to ignore how the counter should count and simply assign arbitrary values to the counter. In many cases, however, specific values for the counters and the relationships among multiple counters are vital to the design. Therefore, assigning arbitrary values to counters during the verification process may result in unreliable verification. Accordingly, there is a need for simplifying the verification of designs that have counters while avoiding errors caused by arbitrary assigning of values to the counters.

SUMMARY OF THE INVENTION

To enable reliable verification of circuit designs that use counters, the invention provides methods, systems, and computer-readable media for simplifying counters in a circuit design while not ignoring the important implications of the counters in the design. This is achieved by abstracting the counter so that it has fewer states, thus eliminating the redundancies of treating every possible value of a counter as a separate state.

In one embodiment, a counter abstraction tool detects a counter in a circuit design. After detecting the counter, the tool identifies at least one special value for the counter, where the special value corresponds to a value of the counter that causes an effect in the circuit when the counter reaches that value. Using the identified special value or values, the tool then forms an abstraction model of the counter. The abstraction model of the counter has a fewer number of states than the counter itself, thereby simplifying the counter for the verification process. The abstraction model is then used to verify the circuit design.

After the extraction of information, the tool can abstract the counter in multiple ways. The tool can automatically perform the abstraction, guide the user in configuring the appropriate abstraction for the counters and their relationships, or perform a combination of automatic and manual abstraction.

By not storing every possible value for the counter, the formal verification process can move through the "interesting" values of the counter more quickly while skipping the intermediate values. For example, if the counter were used to implement a timeout of 1000 cycles, it would take more than 1000 cycles for a traditional formal verification algorithm to detect a bug in the circuit design involving the timeout. But with counter abstraction, a formal verification algorithm could verify a design with an arbitrary timeout without having to iterate through all of the cycles; therefore, it can verify a design for any timeout value.

BRIEF DESCRIPTION OF THE DRAWINGS

FIG. 8 shows the steps in the verification for the counter of FIG. 6 and for the abstraction of the counter shown in FIG. 7, in accordance with an embodiment of the invention.

FIG. 9 is a dialog window in a graphical user interface for prompting a user to select special values for a counter, in accordance with an embodiment of the invention.

DETAILED DESCRIPTION OF THE PREFERRED EMBODIMENTS

To perform functional verification of a digital design that includes one or more counters, a formal verification system includes a counter abstraction tool. The counter abstraction tool detects counters in a circuit design and extracts appropriate information about the detected counters. Using the information extracted from the circuit design, the tool automatically performs abstraction of the counters, guides a user in manually configuring the appropriate abstraction for the counters, or performs a combination of automatic and manual counter abstraction. The abstraction tool then passes the abstraction of the counters to the verification software, which uses the abstraction for the counters rather than the code that implements them to simplify the verification process.

Figure 1:
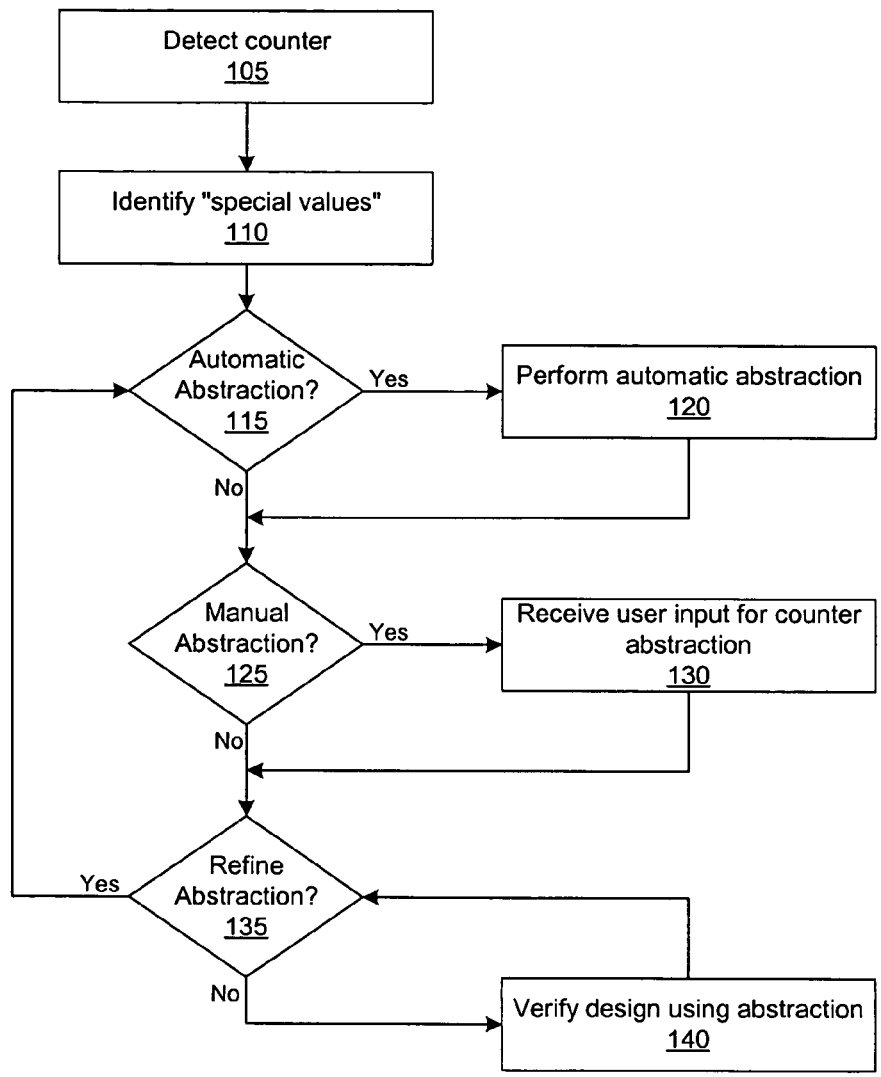
FIG. 1 is a flow diagram of the counter abstraction process in accordance with an embodiment of the invention.

FIG. 1 illustrates a process flow for an embodiment of the counter abstraction process. When presented with a circuit design or a portion of a design, the tool analyzes the design—usually in the form of HDL code—to detect 105 one or more counters. If a counter is detected, the tool then attempts to identify 110 "special values" for the counter. Special values are those values of the counter that cause a reaction in the circuit design. The tool will then generally use these special values to perform 120 an abstraction of the counter automatically. In addition, or alternatively, the tool will receive 130 input from the user that will help the tool determine an abstraction from the user. The tool may 135 then refine the abstraction for the counter. Once the counter abstraction is completed, the tool passes the abstraction to the verification engine, which attempts to verify 140 the circuit design using the abstraction. If the verification is unsuccessful, the tool may further refine the abstraction and repeat the verification process.

In other embodiments of the invention, the tool may ask the user for confirmation of the counter detection result, and the user may pick and choose only some of the "counter" to be abstracted.

Figure 2:
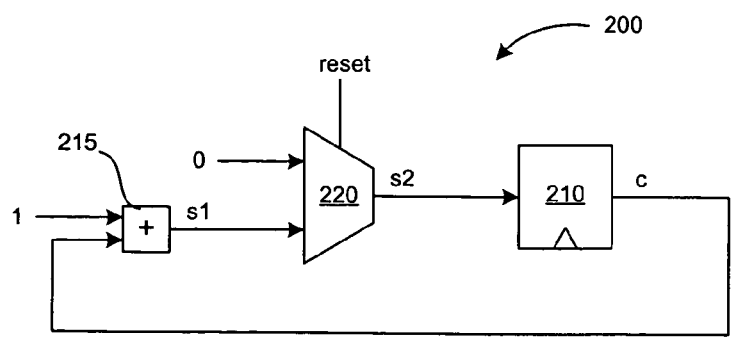
FIG. 2 is a schematic diagram of an example of a portion of a circuit implementing a simple counter.

FIG. 2 is a schematic diagram of a portion of a circuit design that includes a simple counter 200. Although drawn as a single line, the signals in this circuit may have a bit width greater than one. For example, if the counter 200 were a four-bit counter, signal c would have a bit width of four, and the counter could count the integers from 0 to 15. The value of the counter 200 is given by signal c, which is the output of flop 210. This value is fed back into an adder 215 through a multiplexer 220 and then back to the flop 210. The multiplexer 220 allows the counter 200 to be reset through assertion of the reset signal. In RTL, the source code that implements this counter 200 might read:

```
reg[31:0] c;
always @(posedge clk or posedge rst) begin
  if (reset) begin
    c<=0;
  else begin
    c<=c+1;
  end
```

Simply stated, this code increments the signal c at every positive clock transition unless the reset signal is asserted, in which case signal c is initialized to zero.

Figure 3:
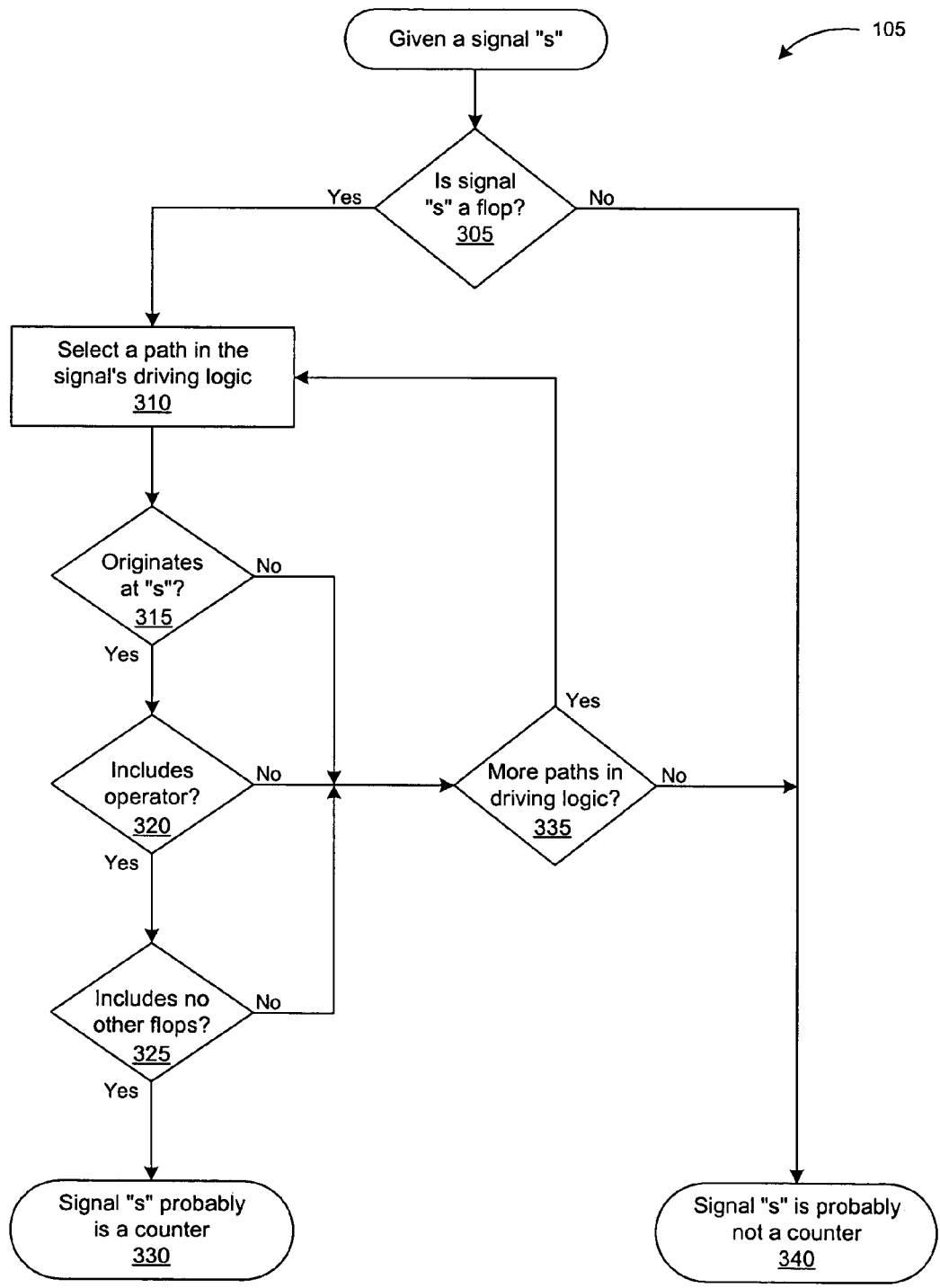
FIG. 3 is a flow diagram of an embodiment for detecting a simple counter in a circuit design, such as the counter shown in FIG. 4, in accordance with an embodiment of the invention.
Figure 4:
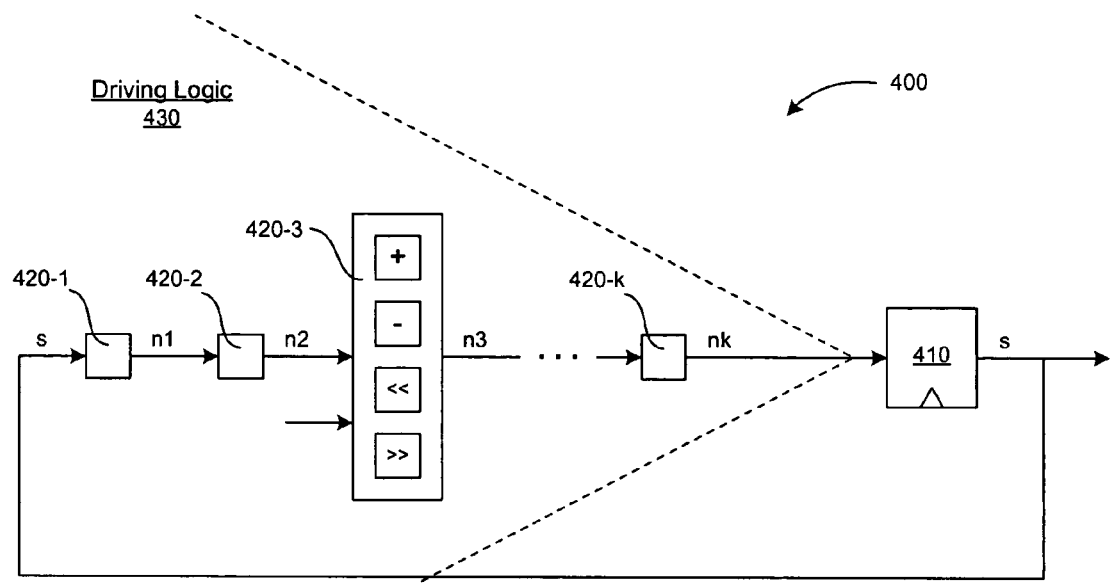
FIG. 4 is a schematic diagram of an example counter and its driving logic.

Counters can take a variety of forms depending on the design of a circuit and the components used in the design. While there is no absolute method of identifying counters in all possible circuit designs, generalities can be made about counters to enable robust detection algorithms. For example, FIG. 3 illustrates a heuristic method for detecting the most commonly used types of counters. The method shown in FIG. 3 can be understood with reference to a generalized example circuit, shown in FIG. 4. FIG. 4 illustrates a portion of a circuit 400 to which the counter detection algorithm is to be applied to determine whether signal s is the output value of a counter. Tracing back in the circuit 400 from the flop 410 are a number of paths (only one shown) that drive the output of the flop 410. The components in these paths form the driving logic 430 of the flop 410. One of the paths in the driving logic 430 includes the output of the flop 410, signal s, which is fed back into the driving logic 430 through a number of circuit components starting at 420-1, through 420-k and eventually to the flop 410.

To determine whether signal s is the output value of a counter, the algorithm first determines 305 whether signal s is the output of a flop. Expanding the algorithm, test 305 may be satisfied if signal s is the output of other types of components that suggest the existence of a counter, such as components that hold a state and are triggered by an input. If the test 305 is not satisfied, the algorithm determines 340 that signal s is probably not the output of a counter. If the test 305 is satisfied, however, signal s may be a counter, depending on the driving logic 430 behind the flop 410.

The algorithm therefore selects 310 a path in the driving logic 430 and then applies a number of heuristic tests to determine whether signal s is a counter. In one test, the algorithm determines 315 whether a selected path originates at signal s. In other words, this test 315 is satisfied when the output of the flop 410 is fed back into the selected path in the driving logic 430. In another test, the algorithm determines 320 whether the selected path includes an operator, such as an adder/subtracter or a multiplier/divider (or bit shifter). In FIG. 4, the illustrated path includes one of these operators as component 420-3. In another test, the algorithm determines 325 whether the path includes additional flops, and the test fails if there are any. To paraphrase these heuristics, the counter detection algorithm determines that a component is likely a counter if its output depends on a modification of its output using the operators +, −, <<, or >> from a previous clock cycle.

If each of the tests 315, 320, and 325 is satisfied, the algorithm determines 330 that signal s is probably the output of a counter. Otherwise, the algorithm determines 335 whether there are additional paths in the driving logic 430, and if so, it selects 310 one of those paths to repeat the testing. To save time, the algorithm may search the driving logic 430 and only select paths in which signal s is found. In this way, the first test 315 will be satisfied, and time is not wasted testing paths that cannot satisfy all of the criteria. Once such a path is found, if any, the algorithm determines whether there are operators and flops in the path, according to tests 320 and 325, and determines the existence of a counter based on those results. Clearly, the tests described with reference to FIG. 3 are heuristics based upon empirical knowledge about the typical design of counters, and they can be performed alone or in combination with additional heuristics, or a completely different set of heuristics could be used to detect the counter. Moreover, these heuristics can evolve as the typical designs of circuits evolve.

In one embodiment, the detection of counters is based on a transversal of the RTL netlist. In many formal tools that create a gate-level netlist for formal verification, it can be very difficult to detect counters. These difficulties are lessened by looking at the high-level operators from the RTL description. Using the information in the high-level operators, counter-like structures can be detected. The heuristics described in connection with FIG. 3 can thus be understood in terms of RTL code. In effect, the algorithm determines whether there exists a dependency path of nets [s, n1, n2, ..., nk, s] such that at least one of nets n1 through nk is an operator, such as +, −, <<, or >>. Additionally, the algorithm may further require that none of nets n1 through nk be flops. This sequence of nets can be described over a "netlist" derived from Verilog. Alternatively, the nets can be described over a net of gates, where the gates are annotated to indicate whether they are derived from a +, −, <<, or >> Verilog operator.

Figure 5:
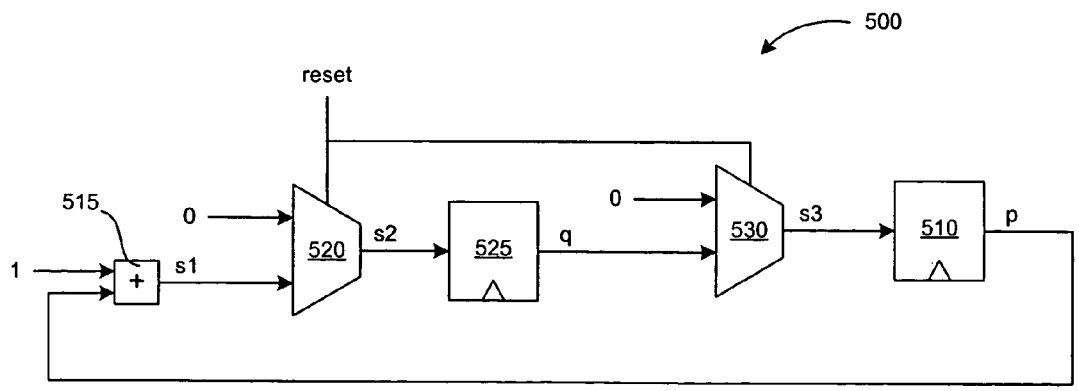
FIG. 5 is a schematic diagram of an example of a half-speed counter.

In another embodiment, the test for detecting counters is relaxed to allow the path from the driving logic to include a flop. This basically eliminates test 325 in FIG. 3. This more generalized approach allows for detection of additional types of counters, such as instances where two flops are used to encode a slow (e.g., half-speed) counter. FIG. 5 shows a schematic of a half-speed counter, which could be implemented by the RTL code:

reg [31:0] p;
req [31:0] q;
always @(posedge clk or posedge rst) begin
if (reset) begin
p<=0;
q<=0;
else begin
p<=q;
q<=p+1;
end By omitting the decision step 325 in FIG. 3, the algorithm is generalized to allow a path that includes flops. Alternatively, the requirement may be relaxed to allow a predetermined number of flops rather than allowing any amount. For example, the algorithm could allow at most one additional flop in the path. In some cases, to avoid spending too high an overhead in detecting counters, or to avoid overly aggressive counter detection, it may be desirable to include a further limitation that there be only one loop between these flops.

While various methods for detecting counters have been described, it should be understood that any of a variety of techniques could be used. For example, the counter detection algorithm can also be designed to read comments in the RTL code that indicate the existence of a counter. Moreover, the method can be adjusted depending on the user's relative aversion to false positives and false negatives. Additional detection rules or heuristics may be added to avoid false positives, while the criteria may be relaxed and some tests eliminated to avoid false negatives. Because of the wide latitude in the possibilities of circuit design, the counter detection algorithm can be designed to accommodate any of a large number of possible designs.

Figure 6:
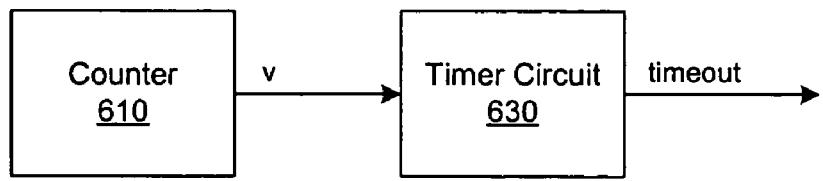
FIG. 6 is a block diagram of an example circuit design that includes a counter.

Once a counter is detected, the abstraction tool determines what values for the counter are "special." Special values for a counter are those values or ranges of values that have a special effect on the rest of the circuit design. The tool thus attempts to determine these special values by examining the circuitry associated with the counter. FIG. 6 illustrates a counter 610, which outputs a signal v that is received by a timer circuit 630. Based on the input from the counter 610, the timer circuit 630 generates a timeout signal. This timer circuit can be implemented, for example, with the RTL code:

```
reg timeout;
always @(posedge clk or posedge rst) begin
  if (v==8) begin
    timeout <=1;
  else begin
    timeout <=0;
  end
```

This code implements a timer circuit 630 that asserts the timeout signal when the counter signal v reaches a value of 8.

Scanning the RTL code, the abstraction tool extracts the special values for the counter by identifying the counter value along with a comparison operator (such as the ==, <=, >=, >, and <operators in the "if" statements and the "case" statements in RTL code). When the value of a counter is compared to a constant, as in the example RTL code above, that constant is determined to be a special value for the counter. Accordingly, in the example above, "8" is determined to be a special value for counter 610, since the value of 8 causes a special case in the output of the timer circuit 630.

When the values of the counters are compared to other signals, rather than constants, the abstraction tool may identify special values in different ways. If the counter value is compared to a signal that is configured once and never changes in value, this reduces to the case in which the counter value is compared to a constant. Thus, the special value for the counter determined to be the value of the signal to which the counter is compared after that signal has been configured. On the other hand, if the counter value is compared to a signal that changes over time, the counter may be linked to one or more other counters in the circuit design. In such a case, determining the special values is more complicated and involves multiple counters, which is discussed in more detail later.

Referring back to the counter 610 of FIG. 6, this counter 610 was determined to have a special value of 8. The counter 610 is therefore abstracted using this special value. The abstraction applies the premise that it does not matter to the circuit design which among a set of adjacent, non-special values the counter 610 has. In counter 610, for example, the counter 610 does not cause a change in the timer circuit 630 as the counter 610 counts up from 1 to 7. The timer circuit 630 does not assert the timeout signal until the counter 610 reaches 8. Accordingly, adjacent, non-special values of the counter 610 (in this case, 1 through 7) are combined into a single state. Assuming the counter can have a maximum value of MAX (where MAX>8), the following four abstraction states are possible:

1. v==0;
2. v>0 && v<8;
3. v==8; or
4. v>8 && v<=MAX.

Figure 7:
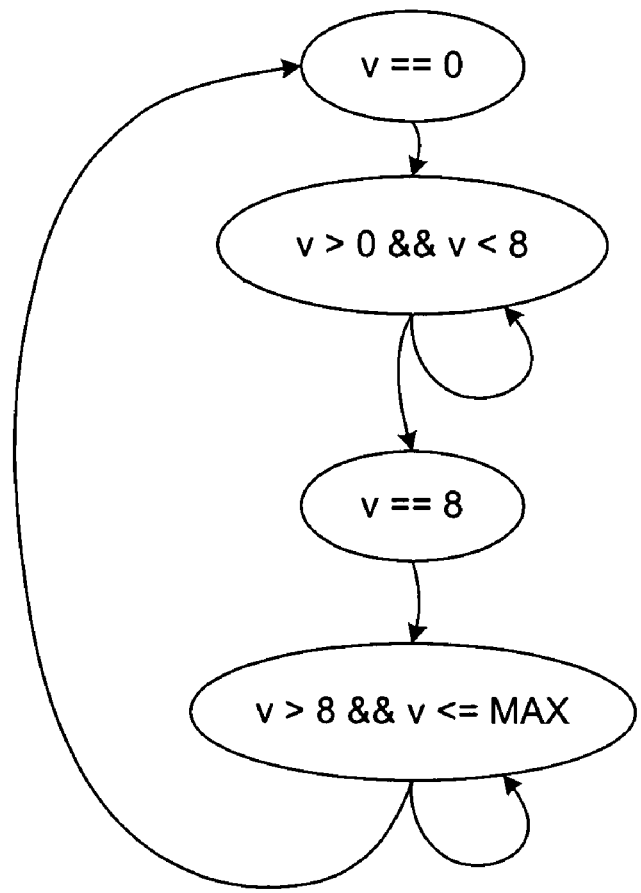
FIG. 7 is a state diagram for an abstraction of the counter of FIG. 6, in accordance with an embodiment of the invention.

Rather than being modeled as having all possible counts as separate states, therefore, the counter 610 can be abstracted with a model that has only these four states. FIG. 7 shows a state diagram for the counter 610 that corresponds to this abstraction. It is noted that this abstraction also considers the value 0 a special value, as the counter is explicitly set to such a constant value when the reset signal is asserted. This abstraction can be further optimized by merging state "v==0" and state "v>0 && v<8" because, although the value 0 is the initial value of the counter, it does not really trigger an action in the reset of the circuit.

FIG. 8 illustrates how this abstraction reduces the complexity of the formal verification process for a circuit with counter 610. In FIG. 8, the steps in the verification process are shown for a circuit with an abstracted counter and one with no abstraction. An example property for the formal verification to prove is given as:

$$p = \overline{\text{timeout}} \| (\text{data} != \text{mem}[0])$$

To paraphrase this criterion, the requirement is satisfied (i.e., the property p is true) as long as the timeout is not asserted or, if the timeout is asserted, the data signal is not the same as the memory indexed at 0.

Table A of FIG. 8 shows the steps for testing the requirement without any counter abstraction. Accordingly, the formal verification engine steps through each possible value of the counter 610 until all possible counts are tested or the requirement fails (i.e., a bug is encountered). In this example, the tool does not reach the bug until the tenth iteration. In contrast, Table B shows the steps for verifying the circuit design with the abstraction model. Using the abstraction, the tool reaches the bug after only four iterations.

It is noted that the steps in Table B do not correspond to the states in FIG. 7. This is because the arrows in FIG. 7 branch from some states, where the counter 610 may remain in the same state or advance to the next state. This is accounted for in the progression of the counter by taking the union of the possible next states. For example, after the "0<v<8" state, the counter 610 may stay in that state, or it may progress to the "v==8" state. Therefore, after the counter 610 is treated as having a value v, where 0<v<8, the counter 610 in the next step is treated as having a value v, where 0<v<8 or v==8.

In general, there are a number of levels of abstractions that the tool can use for each counter. At one extreme, the counter can be modeled with the full counter description as given in its RTL description. At the other extreme, the counter can be treated as free data, able to have any value at any time. In the middle of these two extremes, the counter is modeled using the abstraction provided above with varying numbers of special values. By identifying and using more special values, the abstraction model of the counter will generally be more accurate; however, this leads to additional possible states and thus more complexity.

In one embodiment, the highest level of abstraction is picked by default. If the verification process fails to formally verify a specified property, the tool determines whether the counter being abstracted is relevant to the failure. If the counter is relevant, a lower level of abstraction (e.g., an abstraction with additional special values) is used for the counter, and the verification of the property is attempted again. In this way, the tool tries to verify the property using the least complex and thus the quickest abstraction. Only if the model is insufficient to verify a property does the tool use more complicated and time-consuming abstractions, thereby avoiding waste of computing resources.

The abstraction tool described herein can be incorporated into a formal verification algorithm in many ways. In one embodiment, the abstraction is modeled as a state machine like the one shown in FIG. 7. This state machine is encoded in the input language of a formal verification tool, and the tool directly replaces the actual counter description in the original code with this encoded state machine. The resulting RTL description is then passed onto any formal verification tool for analysis.

In another embodiment, the abstraction is captured as a series of assumptions that relate the current values and the next values of the counters. The actual counter description in the original code is ignored by the tool, while the abstraction is incorporated into the formal verification as a set of assumptions on the free signal originally driven by the counter. This embodiment of the invention enables abstraction without direct manipulation of the RTL description and without introducing explicit state machines. This counter abstraction can be introduced as an assumption in a formal verification tool using a basic Boolean decision diagram (BDD) reachability algorithm.

Well known in the art, BDD refers to a graph-based representation used for Boolean function manipulation. A description of the techniques used to create and manipulate BDDs may be found in R. E. Bryant, "Graph-Based Algorithms for Boolean Function Manipulation", IEEE Transactions on Computers, Vol. C-35, No. 8, August 1986, pp. 677-691. When applying BDDs for reachability analysis, the state-holding elements in the design are translated into a set of BDD variables, the logic described in the RTL description is translated into a set of BDD transition functions, and the environment assumptions (constraints) are translated into a separate set of BDDs. In an embodiment of the current invention, the abstraction, presented by a set of assumption BDDs, is added to the algorithm by appending to the list of user-specified assumption BDDs relating the current value of the counter and the next value of the counter. This process is illustrated in more detail in the example shown in FIGS. 6-8.

The state diagram in FIG. 7 shows an abstraction that is appropriate when the values 0 and 8 are special for the counter 610. For use in the formal verification software, this abstraction is translated into a series of assumptions to be applied to the formal analysis engine. For example, a set of assumptions for counter 610 is written in "if . . . then" form as:

assume v==0→ next(v)>0 && next(v)<8
assume v>0 && v<8→ next(v)>0 && next(v)<=8
assume v==8→ next(v)>8 && next(v)<=MAX
assume v>8 && v<=MAX→ (next(v)>8 && next(v) <=max)
||next(v)==0

These assumptions are then translated into transition functions relating the current value of the counter and the next value of the counter and used in the verification process, as described above. This example assumes that the counter 610 is incremented at each positive edge transition of the corresponding clock.

Systems for performing formal verification, in which the counter abstraction tool described herein can be implemented, are described in co-pending U.S. application Ser. No. 10/606,419, filed Jun. 26, 2003, entitled "Method and Apparatus for Guiding Formal Verification for Circuit Design," and co-pending U.S. application Ser. No. 10/389,316, filed Mar. 14, 2003, entitled "Method for Verifying Properties of a Circuit Model," both of which are fully incorporated herein by reference. These example formal verification systems are cited for illustration purposes, as the counter abstraction techniques described herein can be applied generally to any formal verification process used on circuit designs with counters or counter-like circuitry.

In one embodiment, the tool may receive input from the user regarding the parameters to use for the abstraction process. The user, likely to have some technical insight into the circuit design, is often in a good position to provide guidance for the abstraction process. User input is especially helpful when there are too many possibilities for abstraction, and not all of the possibilities can be attempted serially. In such a case, the user can be prompted to select one or more of the values from a list of candidates for the tool to use as a special value for a particular counter. An example user prompt is illustrated in FIG. 9. By seeking information from the user, the tool receives input based on the user's understanding of the design.

Because the user is prompted only about the design, the user needs only an understanding of the design, not of the formal verification or abstraction processes. The abstraction tool can thus accelerate formal verification engines without requiring the user to learn the technical details of formal verification or abstraction. Effectiveness and ease of use is enhanced by automating the application of the abstraction and by the interactive use model to receive user guidance about multiple possible abstractions and about the relationship of multiple counters. Non-experts in formal verification can verify a design with counters without learning algorithmic or abstraction techniques in formal verification. During the interaction with the tool, they are only given choices related to their designs, and not on choices about specific abstraction techniques.

Figure 10:
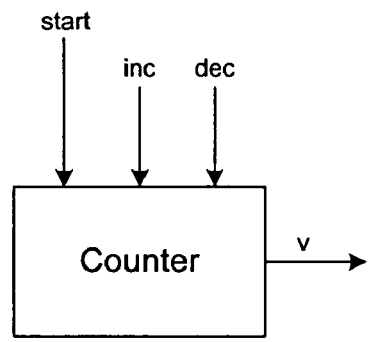
FIG. 10 is a schematic of an example counter with start and direction signals.
Figure 11:
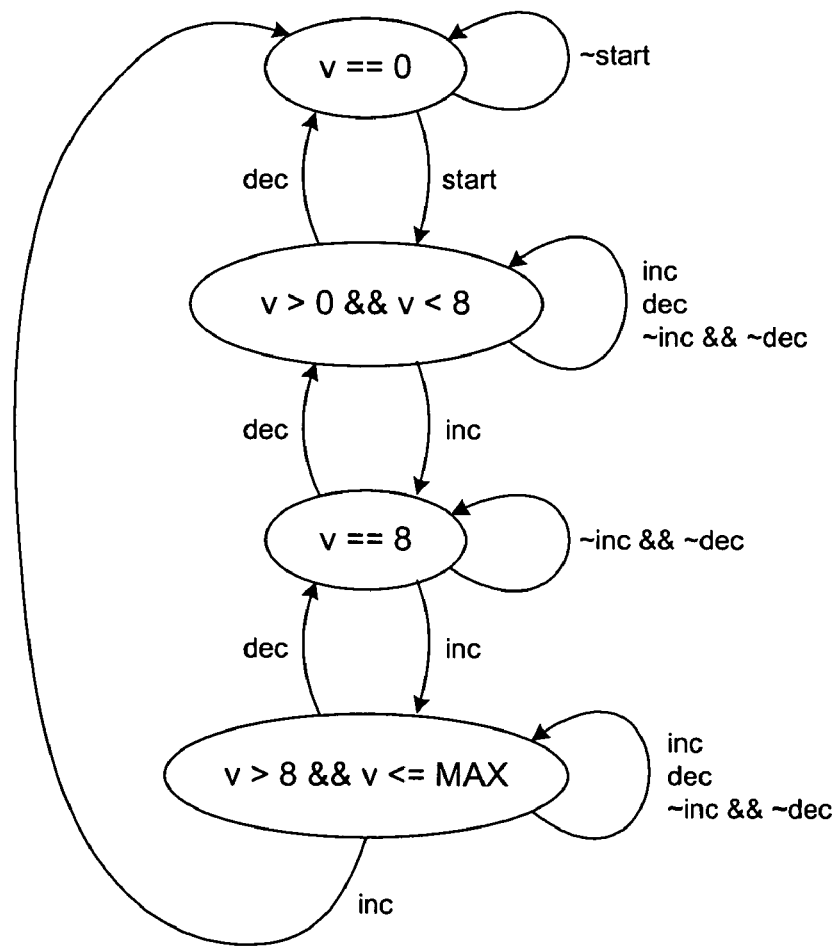
FIG. 11 is a state diagram for an abstraction of the counter of FIG. 10, in accordance with an embodiment of the invention.

The description and examples described above involve a simple counter, counting up, and with special value of 8 to illustrate the process. To increase the utility of the abstraction in other practical scenarios, the basic abstraction model can be extended to include a start signal for the counter and/or direction signals for the counter. FIG. 10 illustrates a counter that receives as inputs a "start" signal (which changes the counter value from 0 to 1) and "inc" and "dec" direction signals. The start signal is asserted to allow the counter to begin counting, and the direction signals, inc and dec, are used to control the direction in which the counter counts. FIG. 11 shows a state diagram for an abstraction of this counter, where special value 8 is used for illustration purposes. As the abstraction model shows, the counter stays at zero until the start signal is asserted, after which the counter either traverses the states or remains in a state depending on whether the inc and dec signals are asserted. Like the abstraction shown in FIG. 7, this abstraction model has four possible states, significantly less complex than if the counter were modeled as having all possible counts for v as separate states. Accordingly, the abstraction techniques described herein can be applied to more complex and practical examples of counters.

In one embodiment, the abstraction shown in FIG. 11 is translated into a series of assumptions to be applied to a formal analysis engine. For example, the start signal can be incorporated into the abstraction model using the set of assumptions:

assume v==0 && start → next(v)==0
assume v==0 && start → next(v)>0 && next(v)<8

Alternatively, the direction signals can be incorporated into the abstraction model using the set of assumptions:

assume v>0 && v<8 && inc → next(v)>0 && next(v)<=8
assume v>0 &&v 8 & dec → next(v)>=0 && next(v)<8
assume (~inc && ~dec) || (inc && dec)→ next(v)==v Similar assumptions apply to the other states in the abstraction as well. Because of the flexibility of these assumptions, any of a wide variety of circuit designs can be incorporated into the abstraction model to accommodate more complex counters. Moreover, these extensions can be performed automatically without guidance from the user. In addition to these examples, various other assumptions can be applied to the basic abstraction model, which gives the model a great flexibility in dealing with a variety of circuit designs.

The abstraction model can also handle abstraction of multiple counters, even if they are synchronized or related. For example, the counter abstraction can be extended to accommodate matching related counters with the direction signals of one counter being a fix-delayed version of another counter and matching related counters with different speeds in their respective clocks. In another embodiment, the counter abstraction tool can synchronize counters that have a loose relationship. In such cases, the user may specify which counters are related, and then the tool synchronizes the abstractions for those counters. These loosely related counters may be related, for example, by being configured to the same initial values (such as the number of data chunks in a communication protocol) or by being incremented or decremented by start and direction signals with fixed or non-fixed delays. As a result, the abstractions of the individual counters can be synchronized.

Figure 12:
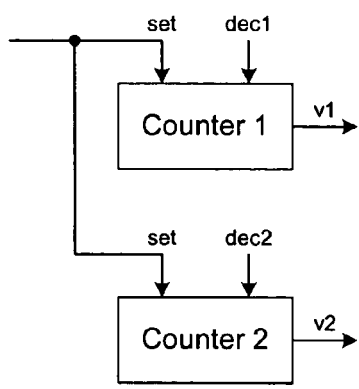
FIG. 12 is a schematic of two example counters related by a fixed delay.

In one example of abstracting two related counters, FIG. 12 illustrates two counters, counter 1 and counter 2, that are initialized to a given value X by a set signal. The counters are then asynchronously decremented towards zero by the dec1 and dec2 signals, respectively. In one application, when the first counter reaches zero, it causes a done signal to be asserted by a related circuit. The goal of the formal verification for this design may be to check that when the second counter reaches zero, the design has generated the right response for that done signal. Such a pair of counters might be used, for example, to verify that a FIFO buffer empties its contents in the proper order. Because each counter causes an action when their value reaches zero, zero is the special value for the counter.

Figure 13:
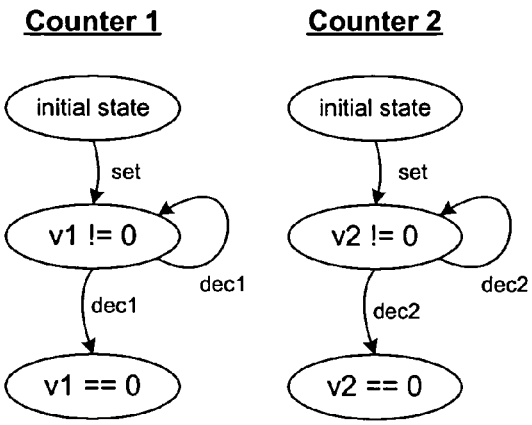
FIG. 13 shows two state diagrams for two counters with set and dec signals, in accordance with an embodiment of the invention.

FIG. 13 shows possible state diagrams for abstractions of the two counters, counter 1 and counter 2. If these two independent counter abstractions with the special value zero were used, however, the formal verification analysis would not be able to finish the proof because the abstraction for the second counter may reach zero while the abstraction for the first counter is still iterating through the loop. Rather than treat these counters separately, therefore, in one embodiment the abstractions for these two counters are merged based on the known relationship between the counters.

Figure 14:
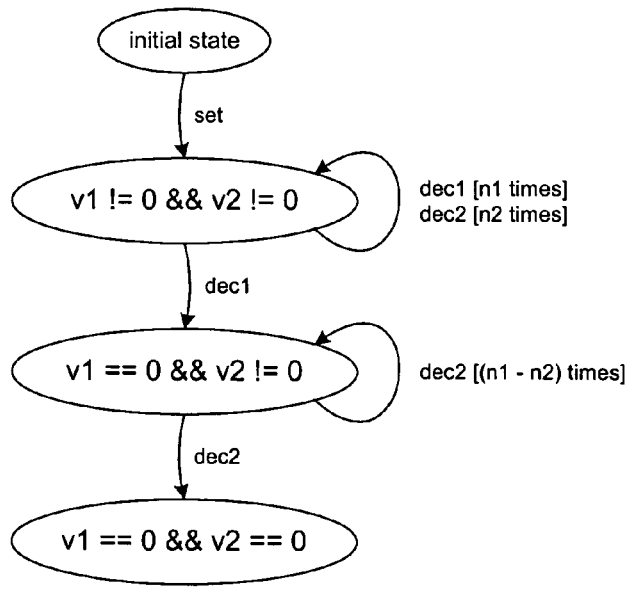
FIG. 14 is a state diagram for an abstraction to link the counters of FIG. 13, in accordance with an embodiment of the invention.

Accordingly, the counter abstraction tool creates an auxiliary common abstraction counter, which merges the abstractions of the two counters. The state diagram of the merged abstraction is shown in FIG. 14. The auxiliary abstraction counter keeps track of the value n1-n2 in the top portion of the state diagram, and it forces the state diagram to go through the exact number of loops in the second to last state in the state diagram (i.e., v1==0 && v2 !=0). While FIG. 14 shows a simplified example for illustration purposes, a person skilled in the art can apply these principles to model an abstraction for a variety of circuit designs having any number of related counters.

As shown in FIG. 14, the common abstraction counter tracks the differences between the two counters, counter 1 and counter 2. As the abstraction shows, both counter 1 and counter 2 are set to the same value (i.e., v1 !=0 && v2 !=0) when the set signal is asserted. During this state, dec1 may be asserted a number of times, defined as "n1," and dec2 may be asserted a number of times, defined as "n2." The next state is encountered when counter 1 reaches zero while counter 2 is nonzero (i.e., v1==0 && v2 !=0). Because each counter was initialized to the same value and the abstraction knows the number of decrements for each counter, the common abstraction counter remains in this state while dec2 is asserted for n1-n2 cycles, after which both counters have reached zero (i.e., v1=0 && v2=0). During formal verification, the abstraction with the common abstraction counter is used in place of counter 1 and counter 2, and all possible values for n1 and n2 are considered.

It is noted that while this example assumes both counters are initialized by the same signal, the abstraction can be extended to separate initialization of the counters. This abstraction also assumes that the number of occurrences of dec1 is always greater than the number of occurrences of dec2. This assumption can be determined by a simple analysis of the RTL description or by a separate formal verification process.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above teachings. It is therefore intended that the scope of the invention be limited not by this detailed description, but rather by the claims appended hereto.

We claim:

1. A computer-implemented method for performing formal verification of a circuit design that includes at least one counter, the method comprising:
    detecting a counter in a circuit design;
    identifying at least one special value for the counter, the special value corresponding to a value of the counter that causes an effect in the circuit when the counter reaches the value;
    forming an abstraction model of the counter using the identified special values, the abstraction model of the counter having a fewer number of states than the counter; and
    verifying the circuit design using the abstraction model in place of the counter in the circuit design.

2. The method of claim 1, wherein detecting a counter comprises structurally analyzing a portion of the circuit design.

3. The method of claim 1, wherein detecting a counter comprises applying a set of heuristics to a portion of the circuit design to determine whether the portion includes a counter.

4. The method of claim 1, wherein detecting a counter at a location in the circuit design comprises determining whether an output of a component in the circuit design depends on an operator modification of the component's output from a previous clock cycle.

5. The method of claim 1, wherein detecting a counter at a location in the circuit design comprises:
    determining whether the location is an output of a flop;
    determining whether a path in a set of driving logic for the flop originates at the location; and
    determining whether the path includes an operator.

6. The method of claim 5, wherein detecting a counter further comprises:
    determining whether the path includes additional flops.

7. The method of claim 1, wherein detecting a counter comprises receiving a user input.

8. The method of claim 1, wherein identifying at least one special value comprises determining a value of the counter that causes an affect on another signal in the circuit design.

9. The method of claim 1, wherein identifying at least one special value comprises:
    scanning an RTL code for the circuit design; and
    identifying a constant value that is compared with a value of the counter in a test statement in the RTL code, the constant value being a special value for the counter.

10. The method of claim 1, wherein identifying at least one special value comprises receiving a user input to select from among a group of candidate special values.

11. The method of claim 1, wherein forming an abstraction model comprises forming a set of assumptions that relate a current value of the counter to a next value of the counter, the set of assumptions for use by a formal verification tool.

12. The method of claim 1, wherein the counter includes a start signal that activates the counter, and wherein the abstraction model of the counter includes a set of assumptions that relate the start signal and a current value of the counter to a next value of the counter.

13. The method of claim 1, wherein the counter includes an increment signal for controlling the direction in which the counter counts, and wherein the abstraction model of the counter includes a set of assumptions that relate the increment signal and a current value of the counter to a next value of the counter.

14. The method of claim 1, further comprising:
refining the abstraction of the counter by adding a special value for the counter in the abstraction model.

15. A computer program product for performing formal verification of a circuit design that includes at least one counter, the computer program product comprising a computer-readable medium containing computer program code for performing the operations:
detecting a counter in a circuit design;
identifying at least one special value for the counter, the special value corresponding to a value of the counter that causes an effect in the circuit when the counter reaches the value;
forming an abstraction model of the counter using the identified special values, the abstraction model of the counter having a fewer number of states than the counter; and
verifying the circuit design using the abstraction model in place of the counter in the circuit design.

16. The computer program product of claim 15, wherein detecting a counter comprises structurally analyzing a portion of the circuit design.

17. The computer program product of claim 15, wherein detecting a counter comprises applying a set of heuristics to a portion of the circuit design to determine whether the portion includes a counter.

18. The computer program product of claim 15, wherein detecting a counter at a location in the circuit design comprises determining whether an output of a component in the circuit design depends on an operator modification of the component's output from a previous clock cycle.

19. The computer program product of claim 15, wherein detecting a counter at a location in the circuit design comprises:
determining whether the location is an output of a flop;
determining whether a path in a set of driving logic for the flop originates at the location; and
determining whether the path includes an operator.

20. The computer program product of claim 19, wherein detecting a counter further comprises:
determining whether the path includes additional flops.

21. The computer program product of claim 15, wherein detecting a counter comprises receiving a user input.

22. The computer program product of claim 15, wherein identifying at least one special value comprises determining a value of the counter that causes an affect on another signal in the circuit design.

23. The computer program product of claim 15, wherein identifying at least one special value comprises:
scanning an RTL code for the circuit design; and
identifying a constant value that is compared with a value of the counter in a test statement in the RTL code, the constant value being a special value for the counter.

24. The computer program product of claim 15, wherein identifying at least one special value comprises receiving a user input to select from among a group of candidate special values.

25. The computer program product of claim 15, wherein the counter includes a start signal that activates the counter, and wherein the abstraction model of the counter includes a set of assumptions that relate the start signal and a current value of the counter to a next value of the counter.

26. The computer program product of claim 15, wherein the counter includes an increment signal for controlling the direction in which the counter counts, and wherein the abstraction model of the counter includes a set of assumptions that relate the increment signal and a current value of the counter to a next value of the counter.

27. The computer program product of claim 15, wherein the computer-readable medium further contains computer program code for performing the operations:
performing formal verification on the circuit design using the abstraction model of the counter.

28. The computer program product of claim 15, wherein the computer-readable medium further contains computer program code for performing the operations:
refining the abstraction of the counter by adding a special value for the counter in the abstraction model.

29. A computer program product for performing formal verification of a circuit design that includes at least one counter, the computer program product comprising a computer-readable medium containing computer program code for performing the operations:
detecting a counter in a circuit design;
identifying at least one special value for the counter, the special value corresponding to a value of the counter that causes an effect in the circuit when the counter reaches the value;
forming an abstraction model of the counter using the identified special values, the abstraction model of the counter having a fewer number of states than the counter, wherein the abstraction model comprises a set of assumptions that relate a current value of the counter to a next value of the counter, the set of assumptions for use by a formal verification tool; and
using the abstraction model of the counter to verify the circuit design.

* * * * *